United States Patent
Matsushita

(10) Patent No.: US 8,178,899 B2
(45) Date of Patent: May 15, 2012

(54) SEMICONDUCTOR DEVICE AND FABRICATION METHOD OF THE SEMICONDUCTOR DEVICE

(75) Inventor: Keiichi Matsushita, Kawasaki (JP)

(73) Assignee: Kabushiki Kaisha Toshiba, Toyko (JP)

(*) Notice: Subject to any disclaimer, the term of this patent is extended or adjusted under 35 U.S.C. 154(b) by 631 days.

(21) Appl. No.: 12/270,236

(22) Filed: Nov. 13, 2008

(65) Prior Publication Data

US 2009/0189188 A1 Jul. 30, 2009

(30) Foreign Application Priority Data

Jan. 24, 2008 (JP) ................... 2008-013720

(51) Int. Cl.
*H01L 29/778* (2006.01)
(52) U.S. Cl. ........ 257/192; 257/194; 257/172; 257/213; 257/183; 257/E29.246; 257/E21.403
(58) Field of Classification Search .................. 257/194, 257/172, 183, 192, 213, E29.246, E21.403
See application file for complete search history.

(56) References Cited

U.S. PATENT DOCUMENTS

| 2005/0263791 A1 | 12/2005 | Yanagihara et al. |
| 2007/0004184 A1 | 1/2007 | Saxler |

FOREIGN PATENT DOCUMENTS

| JP | 2002-141499 | 5/2002 |
| JP | 2007-184379 | 7/2007 |
| JP | 2007-221001 | 8/2007 |
| WO | WO 03/012877 A2 | 2/2003 |
| WO | WO 2004/066393 A1 | 8/2004 |
| WO | WO 2006/110204 A2 | 10/2006 |

OTHER PUBLICATIONS

Min-Woo Ha, et al., "SiO$_2$ Passivation Effects on the Leakage Current in AlGaN/GaN High-Electron-Mobility Transistors Employing Additional Schottky Gate", Japanese Journal of Applied Physics, Japan Society of Applied Physics, vol. 46, No. 4b, Part 01, XP001505855, Apr. 1, 2007, pp. 2291-2295.
A. F. Brana, et al., "Improved AlGaN/GaN HEMTs using Fe doping", Electron Devices, XP010833185, Feb. 2, 2005 pp. 119-121.
Young Chul Choi, et al., "The Effect of an Fe-doped GaN Buffer on Off-State Breakdown Characteristics in AlGaN/GaN HEMTs on Si Substrate", IEEE Transactions on Electron Devices, vol. 53, No. 12, XP011144222, Dec. 1, 2006, pp. 2926-2931.

*Primary Examiner* — Ha Tran T Nguyen
*Assistant Examiner* — Suberr Chi
(74) *Attorney, Agent, or Firm* — Oblon, Spivak, McClelland, Maier & Neustadt, L.L.P.

(57) ABSTRACT

A semiconductor device and a fabrication method of the semiconductor device, the semiconductor device including: a substrate; a nitride based compound semiconductor layer placed on the substrate and doped with a first transition metal atom; an aluminum gallium nitride layer ($Al_xGa_{1-x}N$) (where $0.1 \leq x \leq 1$) placed on the nitride based compound semiconductor layer; a nitride based compound semiconductor layer placed on the aluminum gallium nitride layer ($Al_xGa_{1-x}N$) (where $0.1 \leq x \leq 1$) and doped with a second transition metal atom; an aluminum gallium nitride layer ($Al_yGa_{1-y}N$) (where $0.1 \leq y \leq 1$) placed on the nitride based compound semiconductor layer doped with the second transition metal atom; and a gate electrode, a source electrode, and a drain electrode which are placed on the aluminum gallium nitride layer ($Al_yGa_{1-y}N$) (where $0.1 \leq y \leq 1$). Accordingly, piezo charge is inactivated, leakage current and current collapse are reduced, high frequency characteristics can be improved by obtaining a high resistivity semiconductor layer, and stable high frequency performance can be obtained.

1 Claim, 2 Drawing Sheets

SEMICONDUCTOR DEVICE AND FABRICATION METHOD OF THE SEMICONDUCTOR DEVICE

CROSS REFERENCE TO RELATED APPLICATION AND INCORPORATION BY REFERENCE

This application is based upon and claims the benefit of priority from prior Japanese Patent Application No. P2008-013720 filed on Jan. 24, 2008, the entire contents of which are incorporated herein by reference.

BACKGROUND OF THE INVENTION

1. Field of the Invention

The present invention relates to a semiconductor device and a fabrication method of the semiconductor device. In particular, the present invention relates to a GaN (gallium nitride) related high power semiconductor device for obtaining stabilized high frequency performance, and a fabrication method of the semiconductor device.

2. Description of the Related Art

It is known that FETs (Field Effect Transistors) using a GaN (gallium nitride) related semiconductor have a large amount of current collapse and have a large amount of leakage current. As one of the cause, crystal dislocations and crystal defects in an epitaxial crystal are mentioned.

Since the crystal defect causes fundamental performance degradation, such as an amount of increase of the leakage current and occurring of the current collapse phenomenon, it is dramatically important to obtain an epitaxial layer with little crystal defects.

In order to suppress the amount of crystal dislocations and the amount of crystal defects, a method of inserting an AlGaN (aluminum gallium nitride) layer and an AlN (aluminum nitride) layer into the GaN layer is known.

As shown in FIG. 1, a conventional semiconductor device includes, for example, a substrate 10 composed of SiC, a GaN layer 120 placed on the substrate 10, an AlN layer or an AlGaN layer 16 placed on the GaN layer 120, a GaN layer 200 placed on the AlN layer or the AlGaN layer 16, a AlGaN layer 22 placed on the GaN layer 200, and a gate electrode 26, a source electrode 24, and a drain electrode 28 which are placed on the AlGaN layer 22.

However, since GaN and AlGaN or AlN have a large amount of lattice constant difference, the amount of electric charges is induced between the GaN layer and the AlGaN layer by piezo polarization effect. Therefore, there was a problem that the amount of electric charges induced in the GaN layer degrades the high frequency performance of the semiconductor device extremely.

For example, in FIG. 1, since the GaN layer 120 and the AlN layer or AlGaN layer 16 have a large amount of lattice constant difference, the amount of electric charges is induced between the GaN layer 120 and the AlN layer or the AlGaN layer 16 by piezo polarization effect. Therefore, there is a problem that the amount of electric charges induced in the GaN layer 120 degrades the high frequency characteristics of the semiconductor device extremely. Similarly, since the GaN layer 200 and the AlN layer or AlGaN layer 16 have a large amount of lattice constant difference, the amount of electric charges is induced between the GaN layer 200 and the AlN layer or AlGaN layer 16 by piezo polarization effect. Therefore, there is a problem that the amount of electric charges induced in the GaN layer 200 degrades the high frequency characteristics of a semiconductor device extremely.

The amount of electric charges induced by such piezo polarization effect becomes the cause of increasing the conductivity of the GaN layer 120 or 200, increasing the leakage current between the gate electrode 26 and the source electrode 24 or between the gate electrode 26 and the drain electrodes 28, and reducing power amplification gain of the semiconductor device.

It is already disclosed about a field effect transistor using a GaN related semiconductor which can form a gate size in 0.1 micrometer class and does not occurs the leakage current between the gate electrode and the source electrode, or between the gate electrode and drain inter-electrode, and a fabrication method of the field effect transistor (for example, refer to Patent Document 1). In the Patent Document 1, gate leakage current is reduced by using a field effect transistor which has a gate electrode whose sectional shape is T shape.

Moreover, it is already disclosed about a high resistivity III group nitride semiconductor crystal, a high resistivity group III nitride semiconductor substrate, a semiconductor device and a fabrication method of the high resistivity III group nitride semiconductor crystal (for example, refer to Patent Document 2). In the Patent Document 2, a group III nitride semiconductor crystal in which Fe is doped, for example as transition metals, the group III nitride semiconductor crystal being an Fe doped GaN layer whose value of the concentrations of Gallium atom vacancy is less than or equal to $1\times10^{16}$ $cm^{-3}$, is disclosed. The value of the concentrations of the Ferrum atoms in the Fe dope GaN layer is $5\times10^{17}$ $cm^{-3}$ to $5\times10^{20}$ $cm^{-3}$. Moreover, it is disclosed also about a semiconductor device, which has a semiconductor layer formed on the group III nitride semiconductor substrate composed of the above-mentioned Fe dope GaN layer.

Moreover, it is already disclosed also about a semiconductor element which can perform multilayer formation of a plurality of nitride based compound semiconductor layers, which have a difference of a lattice constant more than a predetermined value, in the effective crystalline state, and can control propagation of penetration dislocation to an epitaxial growth direction (for example, refer to Patent Document 3). However, in the Patent Document 3, it is not disclosed about Fe dope GaN layer for obtaining the high resistivity group III nitride semiconductor crystal.

Patent Document 1:
Japanese Patent Application Laying-Open Publication No. 2002-141499 (Pages 3 to 4 and FIG. 1)

Patent Document 2:
Japanese Patent Application Laying-Open Publication No. 2007-184379 (Pages 6 to 7, FIG. 4 and FIG. 5)

Patent Document 3:
Japanese Patent Application Laying-Open Publication No. 2007-221001 (FIG. 1, FIG. 7, and FIG. 10)

SUMMARY OF THE INVENTION

According to an aspect of the present invention, a semiconductor device comprises: a substrate; a nitride based compound semiconductor layer placed on the substrate and doped with a first transition metal atom; an aluminum gallium nitride layer ($Al_xGa_{1-x}N$) (where $0.1<=x<=1$) placed on the nitride based compound semiconductor layer; a nitride based compound semiconductor layer placed on the aluminum gallium nitride layer ($Al_xGa_{1-x}N$) (where $0.1<=x<=1$) and doped with the second transition metal atom; an aluminum gallium nitride layer ($Al_yGa_{1-y}N$) (where $0.1<=y<=1$) placed on the nitride based compound semiconductor layer doped with the second transition metal atom; and a gate electrode, a source electrode, and a drain electrode which are placed on the aluminum gallium nitride layer ($Al_yGa_{1-y}N$) (where $0.1<=y<=1$).

According to another aspect of the present invention, a semiconductor device comprises: a substrate; a nitride based compound semiconductor layer placed on the substrate and doped with a first transition metal atom; an aluminum gallium nitride layer ($Al_xGa_{1-x}N$) (where $0.1<=x<=1$) placed on the nitride based compound semiconductor layer; a nitride based compound semiconductor layer placed on the aluminum gallium nitride layer ($Al_xGa_{1-x}N$) (where $0.1<=x<=1$) and doped with a second transition metal atom; a non-doped nitride based compound semiconductor layer placed on the nitride based compound semiconductor layer doped with the second transition metal atom; an aluminum gallium nitride layer ($Al_yGa_{1-y}N$) (where $0.1<=y<=1$) placed on the non-doped nitride based compound semiconductor layer; and a gate electrode, a source electrode, and a drain electrode which are placed on the aluminum gallium nitride layer ($Al_yGa_{1-y}N$) (where $0.1<=y<=1$).

According to another aspect of the present invention, a semiconductor device comprises: a substrate; a layered structure in which a three-layered structure is formed repeatedly multiple times, the three-layered structure being composed of a nitride based compound semiconductor layer placed on the substrate and doped with a first transition metal atom, an aluminum gallium nitride layer ($Al_xGa_{1-x}N$) (where $0.1<=x<=1$) placed on the nitride based compound semiconductor layer, and a nitride based compound semiconductor layer placed on the aluminum gallium nitride layer ($Al_xGa_{1-x}N$) (where $0.1<=x<=1$) and doped with a second transition metal atom; an aluminum gallium nitride layer ($Al_yGa_{1-y}N$) (where $0.1<=y<=1$) placed on the layered structure; and a gate electrode, a source electrode, and a drain electrode which are placed on the aluminum gallium nitride layer ($Al_yGa_{1-y}N$) (where $0.1<=y<=1$).

According to another aspect of the present invention, a semiconductor device comprises: a substrate; a layered structure in which a four-layered structure is formed repeatedly multiple times, the four-layered structure is composed of a nitride based compound semiconductor layer placed on the substrate, a nitride based compound semiconductor layer placed on the nitride based compound semiconductor layer and doped with a first transition metal atom, an aluminum gallium nitride layer ($Al_xGa_{1-x}N$) (where $0.1<=x<=1$) placed on the nitride based compound semiconductor layer which doped with the first transition metal atom, and a nitride based compound semiconductor layer placed on the aluminum gallium nitride layer ($Al_xGa_{1-x}N$) (where $0.1<=x<=1$) and doped with a second transition metal atom; a non-doped nitride based compound semiconductor layer placed on the layered structure; an aluminum gallium nitride layer ($Al_yGa_{1-y}N$) (where $0.1<=y<=1$) placed on the non-doped nitride based compound semiconductor layer; and a gate electrode, a source electrode, and a drain electrode which are placed on the aluminum gallium nitride layer ($Al_yGa_{1-y}N$) (where $0.1<=y<=1$).

According to another aspect of the present invention, a fabrication method of a semiconductor device comprises: forming a nitride based compound semiconductor layer doped with a first transition metal atom, on a substrate; forming an aluminum gallium nitride layer ($Al_xGa_{1-x}N$) (where $0.1<=x<=1$) on the nitride based compound semiconductor layer; forming a nitride based compound semiconductor layer doped with a second transition metal atom, on the aluminum gallium nitride layer ($Al_xGa_{1-x}N$) (where $0.1<=x<=1$); forming a non-doped nitride based compound semiconductor layer on the nitride based compound semiconductor layer doped with the second transition metal atom; forming an aluminum gallium nitride layer ($Al_yGa_{1-y}N$) (where $0.1<=y<=1$) on the non-doped nitride based compound semiconductor layer; and forming a gate electrode, a source electrode, and a drain electrode, on the aluminum gallium nitride layer ($Al_yGa_{1-y}N$) (where $0.1<=y<=1$).

According to the present invention, piezo charge can be inactivated, high frequency characteristics can be improved by obtaining a high resistivity semiconductor layer, and a highly efficient semiconductor device and a fabrication method of the semiconductor device can be provided, by impurity doping the transition metal atom in the gallium nitride (GaN) layer which sandwiches the upper and lower sides of the AlGaN layer or the AlN layer.

Moreover, according to the present invention, a crystal defect of the GaN layer is reduced, an amount of leakage current and an amount of current collapse can be reduced, and a semiconductor device of stable high frequency performance and a fabrication method of the semiconductor device can be provided.

DETAILED DESCRIPTION OF THE EMBODIMENTS

Figure 1:
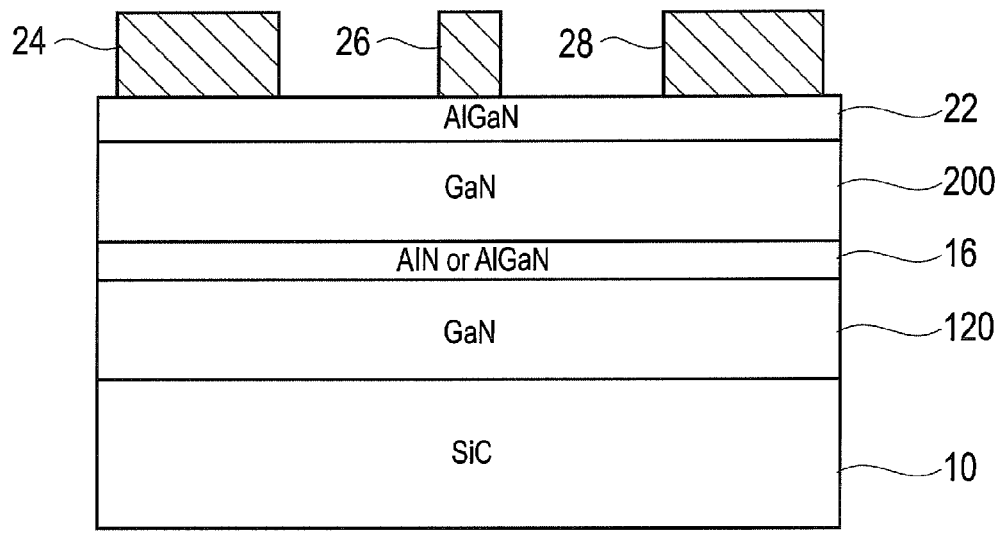
FIG. 1 is a schematic section structure chart showing a semiconductor device according to a conventional example.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

[First Embodiment]
(Device Structure)

Figure 2:
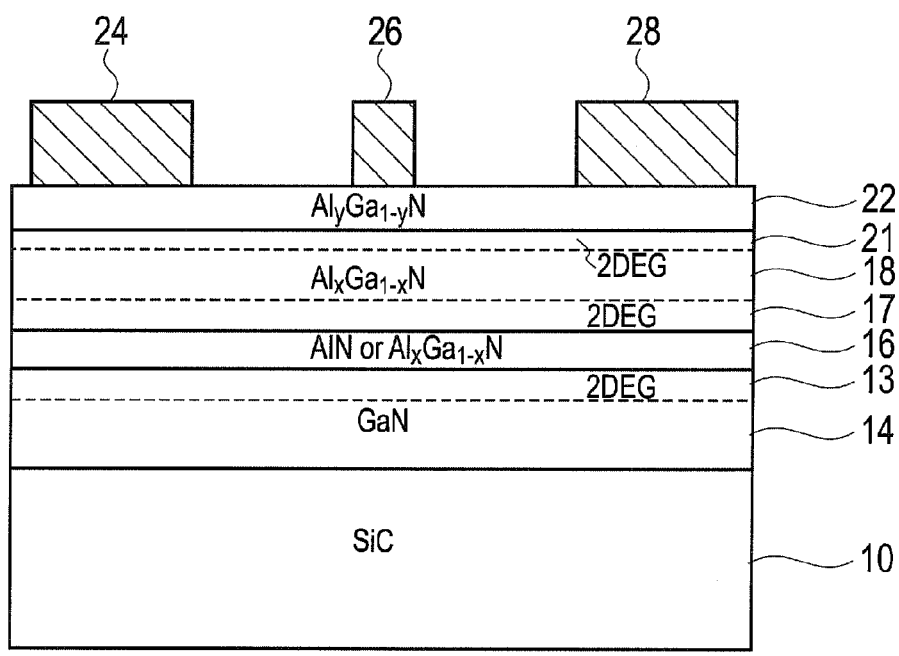
FIG. 2 is a schematic section structure chart showing a semiconductor device according to a first embodiment of the present invention.

As shown in FIG. 2, a semiconductor device according to a first embodiment of the present invention includes: a substrate 10; a nitride based compound semiconductor layer 14 which is placed on the substrate 10 and is doped with a first transition metal atom; an aluminum gallium nitride layer ($Al_xGa_{1-x}N$) (where $0.1<=x<=1$) 16 placed on the nitride based compound semiconductor layer 14 doped with the first transition metal atom; a nitride based compound semiconductor layer 18 which is placed on the aluminum gallium nitride layer ($Al_xGa_{1-x}N$) (where $0.1<=x<=1$) 16, and is doped with a second transition metal atom; an aluminum gallium nitride layer ($Al_yGa_{1-y}N$) (where $0.1<=y<=1$) 22 placed on the nitride based compound semiconductor layer 18 doped with the second transition metal atom; and a gate electrode 26, a source electrode 24, and a drain electrode 28 which are placed on the aluminum gallium nitride layer ($Al_yGa_{1-y}N$) (where $0.1<=y<=1$) 22.

A two-dimensional electron gas layer 13 is formed in an interface of the nitride based compound semiconductor layer 14 doped with the first transition metal atom, and the aluminum gallium nitride layer ($Al_xGa_{1-x}N$) (where $0.1<=x<=1$) 16 placed on the nitride based compound semiconductor layer 14 doped with the first transition metal atom.

Similarly, a two-dimensional electron gas layer 17 is formed in an interface of the aluminum gallium nitride layer ($Al_xGa_{1-x}N$) (where $0.1<=x<=1$) 16 and the nitride based compound semiconductor layer 18 which is placed on the aluminum gallium nitride layer ($Al_xGa_{1-x}N$) (where $0.1<=x<=1$) 16 and is doped with the second transition metal atom.

Furthermore, a two-dimensional electron gas layer 21 is formed in an interface of the nitride based compound semiconductor layer 18 doped with the second transition metal atom, and the aluminum gallium nitride layer ($Al_yGa_{1-y}N$) (where $0.1<=y<=1$) 22 placed on the nitride based compound semiconductor layer 18 doped with the second transition metal atom.

The substrate 10 can be composed of a silicon carbide (SiC) substrate, a semi insulating silicon substrate, and a sapphire substrate, etc.

The nitride based compound semiconductor layer 14 and the nitride based compound semiconductor layer 18 are formed, for example, by a GaN layer.

The gate electrode 26 can be formed, for example, by Ni/Au, and the source electrode 24 and the drain electrode 28 can formed, for example, by Ti/Au.

The first transition metal atom and the second transition metal atom are one or two or more transition metal atoms, which are selected from a group composed of ferrum (Fe), titanium (Ti), vanadium (V), chromium (Cr), manganese (Mn), cobalt (Co), nickel (Ni), and copper (Cu).

In particular, when the first transition metal atom and the second transition metal atom are ferrum (Fe), each of the impurity doping concentrations of the Fe atom in the nitride based compound semiconductor layer 14 and the nitride based compound semiconductor layer 18 is more than $1 \times 10^7$ $cm^{-3}$. Preferably, the impurity doping concentrations of the Fe atom are more than $7 \times 10^{17}$ $cm^{-3}$. It is because the nitride based compound semiconductor layer 14 and the nitride based compound semiconductor layer 18 can be securely made semi-insulating through impurity doping of the Fe atom more than $7 \times 10^{17}$ $cm^{-3}$.

According to the semiconductor device according to the first embodiment of the present invention, the piezo charge can be inactivated and the high resistivity GaN layers 14 and 18 can be obtained by impurity doping the transition metal atom in the GaN layer 14 and the GaN layer 18 which sandwich the upper and lower sides of the aluminum gallium nitride layer ($Al_xGa_{1-x}N$) (where $0.1<=x<=1$) 16.

As a result, an amount of leakage current between the gate electrode 26 and the source electrode 24 or between the gate electrode 26 and the drain electrode 28 can be reduced.

Moreover, the two-dimensional electron gas layer 17 is made to electrically ground state in high frequency region by GaN layer 18 being high resistivity layer, and a capacitor is formed between the two-dimensional electron gas layers 17 and 21 by inserting the GaN layer 18. The value of the parasitic capacitance is also reduced and the high frequency characteristic of the semiconductor device also further improves by performing the value of the thickness of the GaN layer 18, for example more than a predetermined value of about 1 micrometer.

Moreover, a capacitor is formed between the two-dimensional electron gas layer 13 and the SiC substrate 10 by inserting the GaN layer 14 between the two-dimensional electron gas layer 13 and the SiC substrate 10, and the two-dimensional electron gas layer 13 is made to electrically ground state in high frequency region with the two-dimensional electron gas layer 17 and the aluminum gallium nitride layer ($Al_xGa_{1-x}N$) (where $0.1<=x<=1$) 16, by the GaN layer 14 being high resistivity layer.

As a result, the value of the parasitic capacitance is also reduced and the high frequency characteristic of the semiconductor device also further improves.

Moreover, according to the first embodiment of the present invention, the semiconductor device of stable high frequency performance, which reduces the crystal defect of the GaN layer, reduces the amount of leakage current and reduces the amount of current collapse, and improves the power amplification gain, can be provided.

[Second Embodiment]
(Device Structure)

Figure 3:
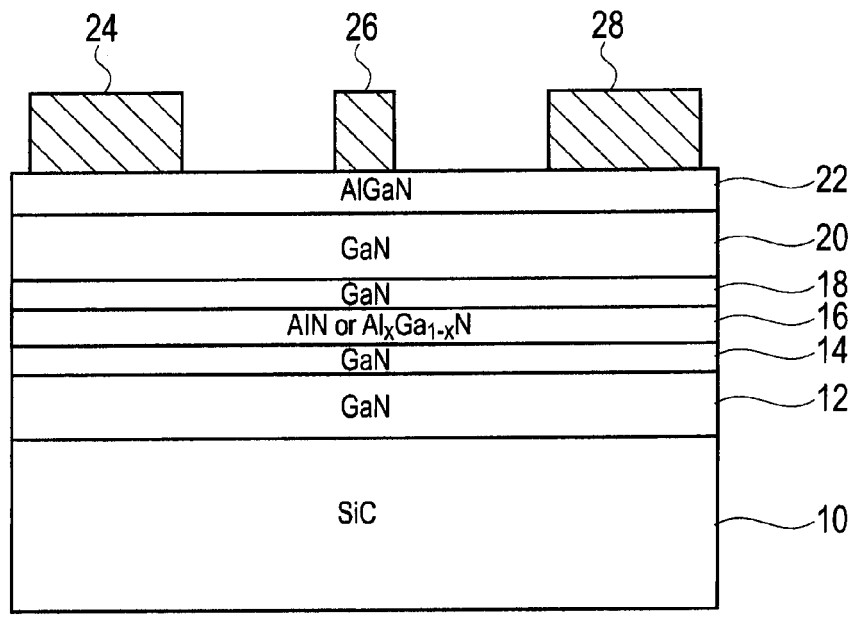
FIG. 3 is a schematic section structure chart showing a semiconductor device according to a second embodiment of the present invention.

As shown in FIG. 3, a semiconductor device according to a second embodiment of the present invention includes: a substrate 10; a nitride based compound semiconductor layer 12 which is placed on the substrate 10; a nitride based compound semiconductor layer 14 which is placed on the nitride based compound semiconductor layer 12 and is doped with a first transition metal atom; an aluminum gallium nitride layer ($Al_xGa_{1-x}N$) (where $0.1<=x<=1$) 16 which is placed on the nitride based compound semiconductor layer 14 doped with the first transition metal atom; a nitride based compound semiconductor layer 18 which is placed on the aluminum gallium nitride layer ($Al_xGa_{1-x}N$) (where $0.1<=x<=1$) 16, and is doped with a second transition metal atom; a non-doped nitride based compound semiconductor layer 20 placed on the nitride based compound semiconductor layer 18 doped with the second transition metal atom; an aluminum gallium nitride layer ($Al_yGa_{1-y}N$) (where $0.1<=y<=1$) 22 placed on the non-doped nitride based compound semiconductor layer 20; and a gate electrode 26, a source electrode 24, and a drain electrode 28 which are placed on the aluminum gallium nitride layer ($Al_yGa_{1-y}N$) (where $0.1<=y<=1$) 22.

An electric charge induced by piezo polarization effect can be inactivated by intervening the nitride based compound semiconductor layer 14 doped with the first transition metal atom between the nitride based compound semiconductor layer 12 and the aluminum gallium nitride layer ($Al_xGa_{1-x}N$) (where $0.1<=x<=1$) 16. As a result, an interface between the nitride based compound semiconductor layer 12 and the aluminum gallium nitride layer ($Al_xGa_{1-x}N$) (where $0.1 \leq x \leq 1$) 16 can be high resistivity layer, and an amount of generating leakage current can be suppressed.

Similarly, an electric charge induced by piezo polarization effect can be inactivated by intervening the nitride based compound semiconductor layer 18, doped with the second transition metal atom, between the non-doped nitride based compound semiconductor layer 20 and the aluminum gallium nitride layer ($Al_xGa_{1-x}N$) (where $0.1 \leq x \leq 1$) 16. As a result, an interface between the non-doped nitride based compound semiconductor layer 20 and the aluminum gallium nitride layer ($Al_xGa_{1-x}N$) (where $0.1 \leq x \leq 1$) 16 can be high resistivity layer, and an amount of generating leakage current can be suppressed.

Although the two-dimensional electron gas layer 21 is formed in the interface between the non-doped nitride based compound semiconductor layer 20 and the aluminum gallium nitride layer ($Al_yGa_{1-y}N$) (where $0.1 \leq y \leq 1$) 22 placed on the non-doped nitride based compound semiconductor layer 20 as well as FIG. 2, the showing in the figure is omitted in FIG. 3.

The substrate 10 can be composed of a silicon carbide (SiC) substrate, a semi insulating silicon substrate, and a sapphire substrate, etc.

The nitride based compound semiconductor layer 12, the nitride based compound semiconductor layer 14 doped with the first transition metal atom, the nitride based compound semiconductor layer 18 doped with the second transition metal atom, and the non-doped nitride based compound semiconductor layer 20 are formed, for example, by a GaN layer.

The gate electrode 26 can be formed, for example, by Ni/Au, and the source electrode 24 and the drain electrode 28 can formed, for example, by Ti/Au.

The first transition metal atom and the second transition metal atom are one or two or more transition metal atoms which are selected from a group composed of ferrum (Fe), titanium (Ti), vanadium (V), chromium (Cr), manganese (Mn), cobalt (Co), nickel (Ni), and copper (Cu).

In particular, when the first transition metal atom and the second transition metal atom are ferrum (Fe), each of the impurity doping concentrations of the Fe atom in the nitride based compound semiconductor layer 14 and the nitride based compound semiconductor layer 18 is more than $1 \times 10^{17}$ cm$^{-3}$.

(Fabrication Method)

A fabrication method of the semiconductor device according to the second embodiment of the present invention includes the step of: forming the nitride based compound semiconductor layer 14 doped with the first transition metal atom on the substrate 10; forming the aluminum gallium nitride layer ($Al_xGa_{1-x}N$) (where $0.1 \leq x \leq 1$) 16 on the nitride based compound semiconductor layer 14; forming the nitride based compound semiconductor layer 18 doped with the second transition metal atom on the aluminum gallium nitride layer ($Al_xGa_{1-x}N$) (where $0.1 \leq x \leq 1$) 16; forming the non-doped nitride based compound semiconductor layer 20 on the nitride based compound semiconductor layer 18 doped with the second transition metal atom; forming the aluminum gallium nitride layer ($Al_yGa_{1-y}N$) (where $0.1 \leq y \leq 1$) 22 on the non-doped nitride based compound semiconductor layer 20; and forming the gate electrode 26, the source electrode 24, and the drain electrode 28 on the aluminum gallium nitride layer ($Al_yGa_{1-y}N$) (where $0.1 \leq y \leq 1$) 22.

In the following, the fabrication method of the semiconductor device according to the second embodiment of the present invention will be explained.

(a) Flow TMG (trimethylgallium) and ammonia gas on the SiC substrate 10, and form the GaN layer 12, for example, in a thickness of about 1 micrometer by epitaxial growth.

(b) Next, form GaN layer 14, for example, in a thickness of about 0.1 micrometer with epitaxial growth, by using same gas series. In this case, Fe is doped by using ferrocene (Cp$_2$Fe: bis(cyclopentadienyl)ferrum) or (HCL) Fe.

(c) Next, flow TMAl (trimethyl aluminum) and ammonia gas, and then form the aluminum gallium nitride layer ($Al_xGa_{1-x}N$) (where $0.1 \leq x \leq 1$) 16, for example, in a thickness of about 20 nm to about 100 nm by epitaxial growth.

(d) Next, form the GaN layer 18 doped with Fe, for example, in a thickness of about 0.1 micrometer, by epitaxial growth as well as processing (b) as described above.

(e) Next, flow TMG (trimethylgallium) and ammonia gas, and then form the GaN layer 20, for example, in a thickness of about 1 micrometer by epitaxial growth as well as processing (a) as described above.

(f) Finally, form the aluminum gallium nitride layer ($Al_{0.3}Ga_{1-0.3}N$) (where $0.1 \leq y \leq 1$) 22 of about 30% of a rate of Al composition ratio in a thickness of about 20 nm by epitaxial growth.

(g) Next, make vacuum evaporation of Ti/Al etc. to the source electrode 24 and the drain electrode 28, and then form an ohmic electrode.

(h) Next, make vacuum evaporation of Ni/Au etc. to the gate electrode 26, and then form a Schottky electrode.

According to the process of the above (a) to (h), the semiconductor device according to the second embodiment of the present invention is completed. As the planar structure, a multi-finger type high power semiconductor device can also be formed, for example.

According to the semiconductor device according to the second embodiment of the present invention, piezo charge can be inactivated and high resistivity GaN layers 14 and 18 can be obtained, by impurity doping the transition metal atom in the GaN layer 14 and the GaN layer 18 which sandwich the upper and lower sides of the aluminum gallium nitride layer ($Al_xGa_{1-x}N$) (where $0.1 \leq x \leq 1$) 16.

As a result, an amount of leakage current between the gate electrode 26 and the source electrode 24 or between the gate electrode 26 and the drain electrode 28 can be reduced.

Moreover, a capacitor is formed in the aluminum gallium nitride layer ($Al_xGa_{1-x}N$) (where $0.1 \leq x \leq 1$) 16 and the aluminum gallium nitride layer ($Al_yGa_{1-y}N$) (where $0.1 \leq y \leq 1$) 22 inserting the GaN layer 20 by the GaN layer 18 being high resistivity layer. The value of the parasitic capacitance is also reduced and the high frequency characteristic of the semiconductor device also further improves by performing thickness of GaN layer 20, for example, more than a predetermined value of about 1 micrometer.

Moreover, a capacitor is formed between the aluminum gallium nitride layer ($Al_xGa_{1-x}N$) (where $0.1 \leq x \leq 1$) 16 and SiC substrate 10 inserting the GaN layer 12 by the GaN layer 14 being high resistivity layer. The value of the parasitic capacitance is also reduced and the high frequency characteristic of the semiconductor device also further improves by performing thickness of GaN layer 12, for example, more than a predetermined value of about 1 micrometer.

Moreover, according to the second embodiment of the present invention, the semiconductor device of stable high frequency performance, which reduces the crystal defect of the GaN layer, reduces the amount of leakage current and the amount of current collapse and improves the power amplification gain, and the fabrication method of the semiconductor device can be provided.

[Third Embodiment]
(Device Structure)

A semiconductor device according to the third embodiment of the present invention includes the layered structure (14, 16, 18) in which the three-layered structure shown in FIG. 2 is formed repeatedly multiple times. The three-layered structure is composed of the nitride based compound semiconductor layer 14 doped with the first transition metal atom, the aluminum gallium nitride layer ($Al_xGa_{1-x}N$) (where $0.1<=x<=1$) 16 placed on the nitride based compound semiconductor layer 14, and the nitride based compound semiconductor layer 18 placed on the aluminum gallium nitride layer ($Al_xGa_{1-x}N$) (where $0.1<=x<=1$) 16 and doped with the second transition metal atom.

That is, the semiconductor device according to the third embodiment of the present invention includes: the substrate 10; the layered structure (14, 16, 18) which is placed on the substrate 10 and in which the three-layered structure is formed repeatedly multiple times (for example, about 2 to 3 times); the aluminum gallium nitride layer ($Al_yGa_{1-y}N$) (where $0.1<=y<=1$) 22 placed on the layered structure (14, 16, 18); and the gate electrode 26, the source electrode 24, and the drain electrode 28 which are placed on the aluminum gallium nitride layer ($Al_yGa_{1-y}N$) (where $0.1<=y<=1$). The three-tiered structure is composed of the nitride based compound semiconductor layer 14 doped with the first transition metal atom, the aluminum gallium nitride layer ($Al_xGa_{1-x}N$) (where $0.1<=x<=1$) 16 placed on the nitride based compound semiconductor layer 14 doped with the first transition metal atom, and the nitride based compound semiconductor layer 18 placed on the aluminum gallium nitride layer ($Al_xGa_{1-x}N$) (where $0.1<=x<=1$) 16 and doped with the second transition metal atom.

Since the detail of each layer is the same as the first embodiment, description is omitted.

Modified Example of the Third Embodiment

Figure 4:
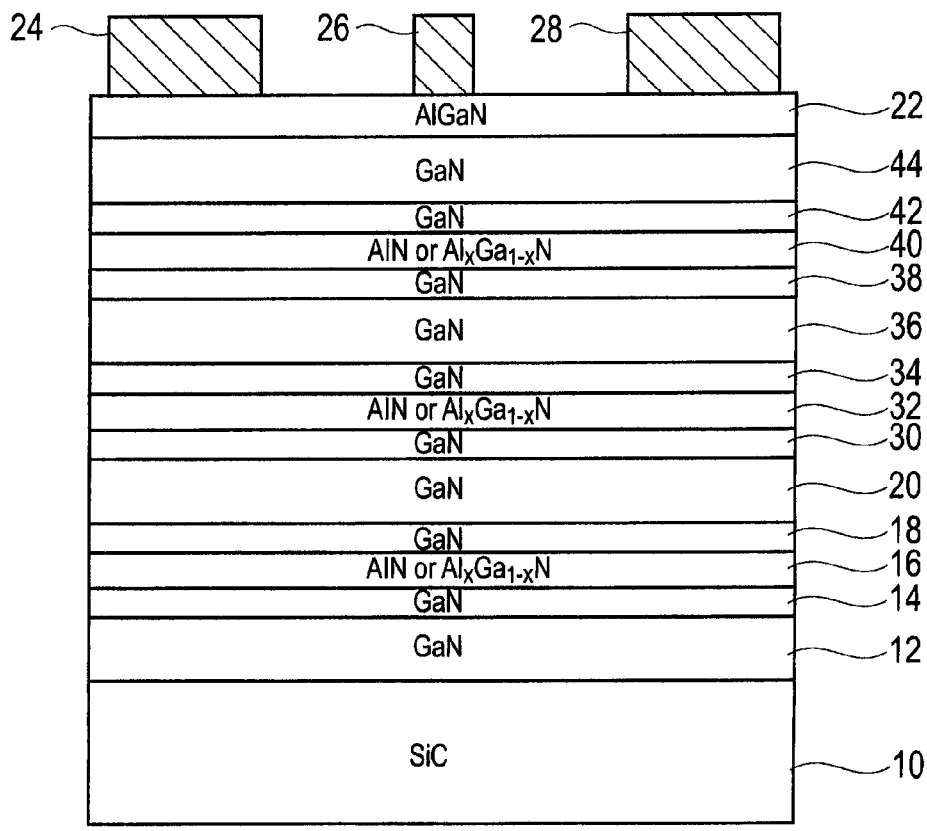
FIG. 4 is a schematic section structure chart showing a semiconductor device according to a third embodiment of the present invention.

Furthermore, as shown in FIG. 4, a semiconductor device according to a modified example of the third embodiment of the present invention includes: a substrate 10; layered structures (12/14/16/18, 20/30/32/34, 36/38/40/42) in which four-layered structure is formed repeatedly multiple times (for example, about 2 to 3 times); a non-doped nitride based compound semiconductor layer 44 placed on the layered structures; an aluminum gallium nitride layer ($Al_xGa_{1-x}N$) (where $0.1<=x<=1$) 22 placed on the non-doped nitride based compound semiconductor layer 44; and a gate electrode 26, a source electrode 24, and a drain electrode 28 which are placed on the aluminum gallium nitride layer ($Al_yGa_{1-y}N$) (where $0.1<=y<=1$) 22. The four-layered structure is composed of a nitride based compound semiconductor layer 12 placed on the substrate 10, a nitride based compound semiconductor layer 14 placed on the nitride based compound semiconductor layer 12 and doped with the first transition metal atom, an aluminum gallium nitride layer ($Al_xGa_{1-x}N$) (where $0.1<=x<=1$) 16 placed on the nitride based compound semiconductor layer 14 doped with the first transition metal atom, and a nitride based compound semiconductor layer 18 placed on the aluminum gallium nitride layer ($Al_xGa_{1-x}N$) (where $0.1<=x<=1$) 16 and doped with the second transition metal atom.

The first transition metal atom and the second transition metal atom are one or two or more transition metal atoms, which are selected from a group composed of ferrum (Fe), titanium (Ti), vanadium (V), chromium (Cr), manganese (Mn), cobalt (Co), nickel (Ni), and copper (Cu).

When the first transition metal atom and the second transition metal atom are ferrum (Fe), each of the impurity doping concentrations of the nitride based compound semiconductor layer (14, 30, 38) and the nitride based compound semiconductor layer (18, 34, 42) is more than $1 \times 10^{17}$ cm$^{-3}$.

Since the detail of each layer is the same as the second embodiment, description is omitted.

According to the semiconductor device according to the third embodiment and the modified example of the third embodiment of the present invention, crystal quality can be improved according to the dislocation suppressing effect in LOG (Lateral OverGrowth) of the aluminum gallium nitride layer ($Al_xGa_{1-x}N$) (where $0.1<=x<=1$), by forming the layered structure in which the layered structure composed of the nitride based compound semiconductor layer placed at the upper and lower sides of the aluminum gallium nitride layer ($Al_xGa_{1-x}N$) (where $0.1<=x<=1$) and doped with the transition metal atom is formed repeatedly multiple times.

According to the third embodiment and the modified example of the third embodiment of the present invention, piezo charge can be inactivated, and high frequency characteristics can be improved by obtaining a high resistivity semiconductor layer, and also crystal quality can be improved by laminated layered-structure, and a highly efficient semiconductor device can be provided, by impurity doping with the transition metal atom in the gallium nitride (GaN) layer which sandwiches the upper and lower sides of the AlGaN layer or the AlN layer.

Moreover, according to the present invention, the amount of crystal defects of the GaN layer can be reduced, and the amount of leakage current and the amount of current collapse can be reduced, and also crystal quality can be improved by laminated layered-structure, and a semiconductor device of stable high frequency performance can be provided.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art.

In addition, it cannot be overemphasized that the amplifying elements are applicable not only to FET but also other amplifying elements, such as HEMT (High Electron Mobility Transistor), LDMOS FET (Lateral Doped Metal-Oxide-Semiconductor Field Effect Transistor) and HBT (Heterojunction Bipolar Transistor).

The substrate region may be provided with either a SiC substrate, a GaN substrate, a substrate in which a GaN epitaxial layer is formed on a SiC substrate, a substrate in which a GaN epitaxial layer is formed on an Si substrate, a substrate in which a heterojunction epitaxial layer composed of GaN/GaAlN is formed on a SiC substrate, a substrate in which a GaN epitaxial layer is formed on a sapphire substrate, a sapphire substrate or a diamond substrate.

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

Industrial Applicability

According to the present invention, a semiconductor device is applied for the semiconductor device with a SiC substrate or a GaN substrate and has a wide range of application fields, such as an internally matched power amplifier, a power MMIC (Monolithic Microwave Integrated Circuit), a microwave power amplifier, and a millimeter-wave power amplifier.

What is claimed is:

1. A semiconductor device comprising:
   a substrate;
   a first nitride based compound semiconductor layer placed on the substrate and doped with a first transition metal atom;
   an aluminum gallium nitride layer ($Al_xGa_{1-x}N$) (where $0.1 \leq x \leq 1$) placed on the first nitride based compound semiconductor layer;
   a second nitride based compound semiconductor layer placed on the aluminum gallium nitride layer ($Al_xGa_{1-x}N$) (where $0.1 \leq x \leq 1$) and doped with a second transition metal atom;
   an aluminum gallium nitride layer ($Al_yGa_{1-y}N$) (where $0.1 \leq y \leq 1$) placed on the second nitride based compound semiconductor layer doped with the second transition metal atom;
   a gate electrode, a source electrode, and a drain electrode which are placed on the aluminum gallium nitride layer ($Al_yGa_{1-y}N$) (where $0.1 \leq y \leq 1$);
   a first two-dimensional electron gas layer formed in an interface of the first nitride based compound semiconductor layer and the aluminum gallium nitride layer ($Al_xGa_{1-x}N$) where $0.1 \leq x \leq 1$);
   a second two-dimensional electron gas layer formed in an interface of the aluminum gallium nitride layer ($Al_xGa_{1-x}N$) (where $0.1 \leq x \leq 1$) and the second nitride based compound semiconductor layer; and
   a third two-dimensional electron gas layer formed in an interface of the second nitride based compound semiconductor layer and the aluminum gallium nitride layer ($Al_yGa_{1-y}N$) (where $0.1 \leq y \leq 1$), wherein
   a layered structure in which a multi-layered structure is formed, the multi-layered structure being composed of the first nitride based compound semiconductor layer doped with the first transition metal atom, the aluminum gallium nitride layer ($Al_xGa_{1-x}N$) (where $0.1 \leq x \leq 1$) placed on the first nitride based compound semiconductor layer, and the first nitride based compound semiconductor layer placed on the aluminum gallium nitride layer ($Al_xGa_{1-x}N$) (where $0.1 \leq x \leq 1$) and doped with the second transition metal atom, and wherein
   the first transition metal atom and the second transition metal atom are ferrum (Fe) and the first nitride based compound semiconductor layer and the second nitride based compound semiconductor layer are made semi-insulating through impurity doping of the ferrum (Fe) atom more than $7 \times 10^{17}$ cm$^{-3}$,
   each of a thickness of the first nitride based compound semiconductor layer and the second nitride based compound semiconductor layer is more than 1 micrometer,
   the second two-dimensional electron gas layer is made to electrically ground state in high frequency operational region of the semiconductor device through a capacitor formed between the second two-dimensional electron gas layer and the third two-dimensional electron gas layer by the second nitride based compound semiconductor layer being made insulating, and
   the first two-dimensional electron gas layer is made to electrically ground state in high frequency operational region of the semiconductor device through a capacitor formed between the first two-dimensional electron gas layer and the substrate by the first nitride based compound semiconductor layer being made insulating.

* * * * *